United States Patent
Koeppel et al.

(10) Patent No.: US 9,848,517 B2
(45) Date of Patent: Dec. 19, 2017

(54) SYSTEM AND METHOD FOR THERMALLY COUPLING MEMORY DEVICES TO A MEMORY CONTROLLER IN A COMPUTER MEMORY BOARD

(71) Applicant: SRC Labs, LLC, Chaska, MN (US)

(72) Inventors: Allan Jeffrey Koeppel, Colorado Springs, CO (US); Douglas Cowles, Colorado Springs, CO (US)

(73) Assignee: Saint Regis Mohawk Tribe, Akwesasne, NY (US)

(*) Notice: Subject to any disclaimer, the term of this patent is extended or adjusted under 35 U.S.C. 154(b) by 445 days.

(21) Appl. No.: 14/284,616

(22) Filed: May 22, 2014

(65) Prior Publication Data

US 2015/0342097 A1 Nov. 26, 2015

(51) Int. Cl.
| | |
|---|---|
| *H05K 5/00* | (2006.01) |
| *H05K 7/20* | (2006.01) |
| *G06F 1/20* | (2006.01) |
| *H05K 7/14* | (2006.01) |
| *H05K 3/30* | (2006.01) |

(Continued)

(52) U.S. Cl.
CPC ......... *H05K 7/20809* (2013.01); *G06F 1/163* (2013.01); *G06F 1/20* (2013.01); *H05K 1/0203* (2013.01); *H05K 3/30* (2013.01); *H05K 7/1485* (2013.01); *H05K 7/2039* (2013.01);

(Continued)

(58) Field of Classification Search
CPC .......... H01L 2023/4068; H05K 1/0203; H05K 2201/10159; H05K 2201/066
See application file for complete search history.

(56) References Cited

U.S. PATENT DOCUMENTS

| | | | | |
|---|---|---|---|---|
| 8,081,473 | B2 * | 12/2011 | Cipolla | H01L 23/4093 |
| | | | | 165/104.33 |
| 8,570,744 | B2 * | 10/2013 | Rau | G06F 1/20 |
| | | | | 361/679.52 |

(Continued)

FOREIGN PATENT DOCUMENTS

| | | |
|---|---|---|
| WO | 2008/082042 A1 | 7/2008 |
| WO | 2011/053313 A1 | 5/2011 |
| WO | 2013095673 A1 | 6/2013 |

OTHER PUBLICATIONS

Extended European Search Report for Application No. 15167764.8, dated Nov. 13, 2015, 7 pages.

(Continued)

*Primary Examiner* — Robert J Hoffberg
*Assistant Examiner* — Hung Dang
(74) *Attorney, Agent, or Firm* — Todd R. Fronek; Larkin Hoffman Daly & Lindgren, Ltd.

(57) ABSTRACT

A system and method for thermally coupling memory devices, such as DIMM memory modules, to an associated memory controller such that both are cooled together at the same relative temperature. By maintaining all of the devices at a much more uniform temperature, memory timing issues are effectively eliminated. In accordance with an exemplary embodiment, the controller chip is physically located between two or more banks of memory, and is positioned under an adjoining heat sink while the memory DIMMs are positioned laterally of the controller chip in angled DIMM slots and are coupled to the controller chip with respective heat spreaders.

26 Claims, 4 Drawing Sheets

(51) Int. Cl.
*H05K 1/02* (2006.01)
*G06F 1/16* (2006.01)

(52) U.S. Cl.
CPC .............. *H05K 7/20836* (2013.01); *H05K 2201/10159* (2013.01); *Y10T 29/49131* (2015.01)

(56) References Cited

U.S. PATENT DOCUMENTS

| | | |
|---|---|---|
| 2007/0170580 A1 | 7/2007 | Baek et al. |
| 2007/0257359 A1 | 11/2007 | Reis et al. |
| 2008/0013282 A1 | 1/2008 | Hoss et al. |
| 2008/0086282 A1 | 4/2008 | Artman et al. |

OTHER PUBLICATIONS

Japanese first non-final "Notice of Reasons for Rejection" with organized translation for Patent Application 2015-030055, dated Jun. 9, 2015, 2 pages.

\* cited by examiner

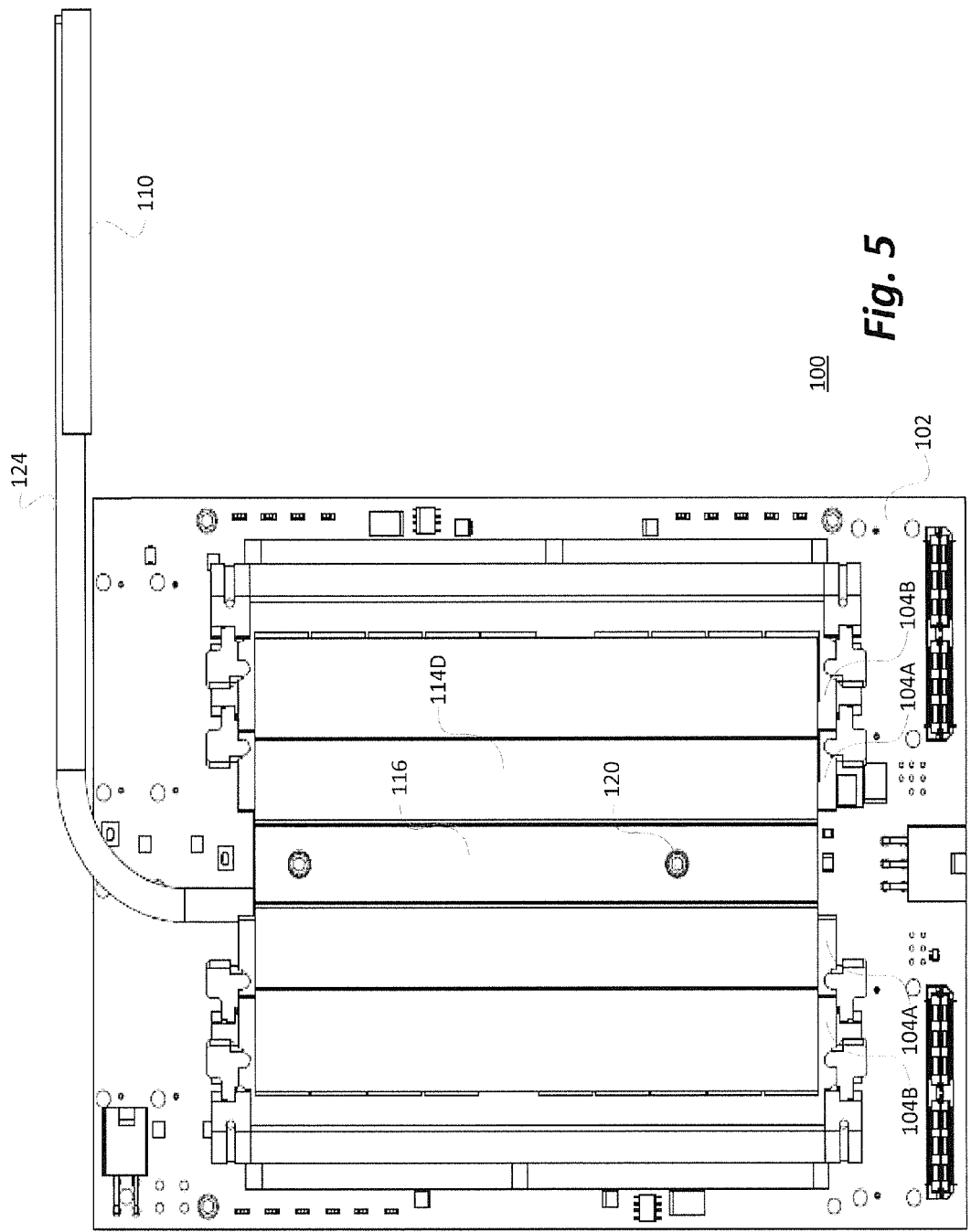

SYSTEM AND METHOD FOR THERMALLY COUPLING MEMORY DEVICES TO A MEMORY CONTROLLER IN A COMPUTER MEMORY BOARD

BACKGROUND OF THE INVENTION

The present invention relates, in general, to the field of computer systems, including computer memory boards, memory modules, scalable servers and rack mounted systems. More particularly, the present invention relates to a system and method for thermally coupling memory devices to a memory controller in a computer memory board.

Memory devices and their respective controllers must operate within a limited temperature range in order for the memory to meet necessary timing specifications. At present, many different techniques have been employed in an attempt to provide cooling methods for memory modules such as cooling fans, heat sinks, heat spreaders and the like. However, the memory and associated controller devices have heretofore always been cooled through the use of separate devices and techniques.

The problem with this conventional approach is that the memory devices and controller will operate independently at differing temperatures as the operating temperature of the computer memory board fluctuates. In this regard, the controller chip is generally located under a relatively large heat sink, while the memory device DIMMs (dual in-line memory modules) are independently cooled by individual heat spreaders. Each memory module and the controller chip are separate devices and as operating temperatures fluctuate, each separate device will be operating at a different temperature, depending on the controller heat sink size and air flow. As such, the timing window specified by the designer will tend to shift away from its optimum design intent, due to the relatively large temperature difference of each of the devices.

Therefore, it would be highly advantageous to provide a system and method for thermally coupling the memory devices to their associated memory controller such that the timing window would not shift as the operating temperature of the devices fluctuate and such that all of the system memory and controller will operate at the same uniform temperature.

SUMMARY OF THE INVENTION

In accordance with a representative embodiment of the present invention, the memory device modules (e.g. DIMMs) may be both mechanically and thermally coupled to their associated memory controller. In accordance with the exemplary embodiment disclosed herein, the controller chip is physically located between two banks of memory, and is positioned under a heat sink comprising an evaporator plate, heat pipe and condenser plate. The memory DIMMs are positioned laterally of the controller chip in angled DIMM slots and are coupled to the controller chip heat sink with respective heat spreaders.

The system and method of the present invention for thermally coupling the memory devices to the controller chip function to maintain all of the devices at a much more uniform temperature, thereby effectively eliminating memory timing issues. As discussed previously, utilizing conventional cooling approaches, the timing window for the memory will shift as the temperature changes. In accordance with the present invention, since all of the memory components are thermally joined together, this window will track uniformly.

It should be noted that the technique of the present invention can be applied to any method of cooling available such as a heat pipe, but an air cooled, liquid cooled heat sink or other means of conductive cooling could be employed as well without departing from the scope of the present invention. Functionally, the system and method disclosed herein operate to keep all of the memory devices and the controller chip operating at the same temperature.

Particularly disclosed herein is a computer memory board which comprises at least one memory module, wherein the memory board comprises a circuit board comprising at least one bank of memory devices and an associated memory controller. A heat sink adjoins the memory controller and a heat spreader adjoins the at least one bank of memory devices. A clamping device thermally couples the heat sink to the heat spreader.

Further disclosed herein is a method for controlling the operating temperature of a computer memory board comprising the steps of providing a circuit board comprising a memory controller and at least one bank of memory devices; also providing a heat sink adjoining the memory controller; further providing a heat spreader adjoining the at least one bank of memory devices and thermally coupling the heat sink and the heat spreader.

Still further disclosed herein is a computer memory board which comprises at least one memory module, a memory controller associated with the memory module with the memory module and the memory controller being thermally coupled together such that the memory module and the memory controller substantially track together in temperature.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein:

FIG. 5 is a top plan view of the representative embodiment of the preceding figures.

DESCRIPTION OF A REPRESENTATIVE EMBODIMENT

Figure 1:
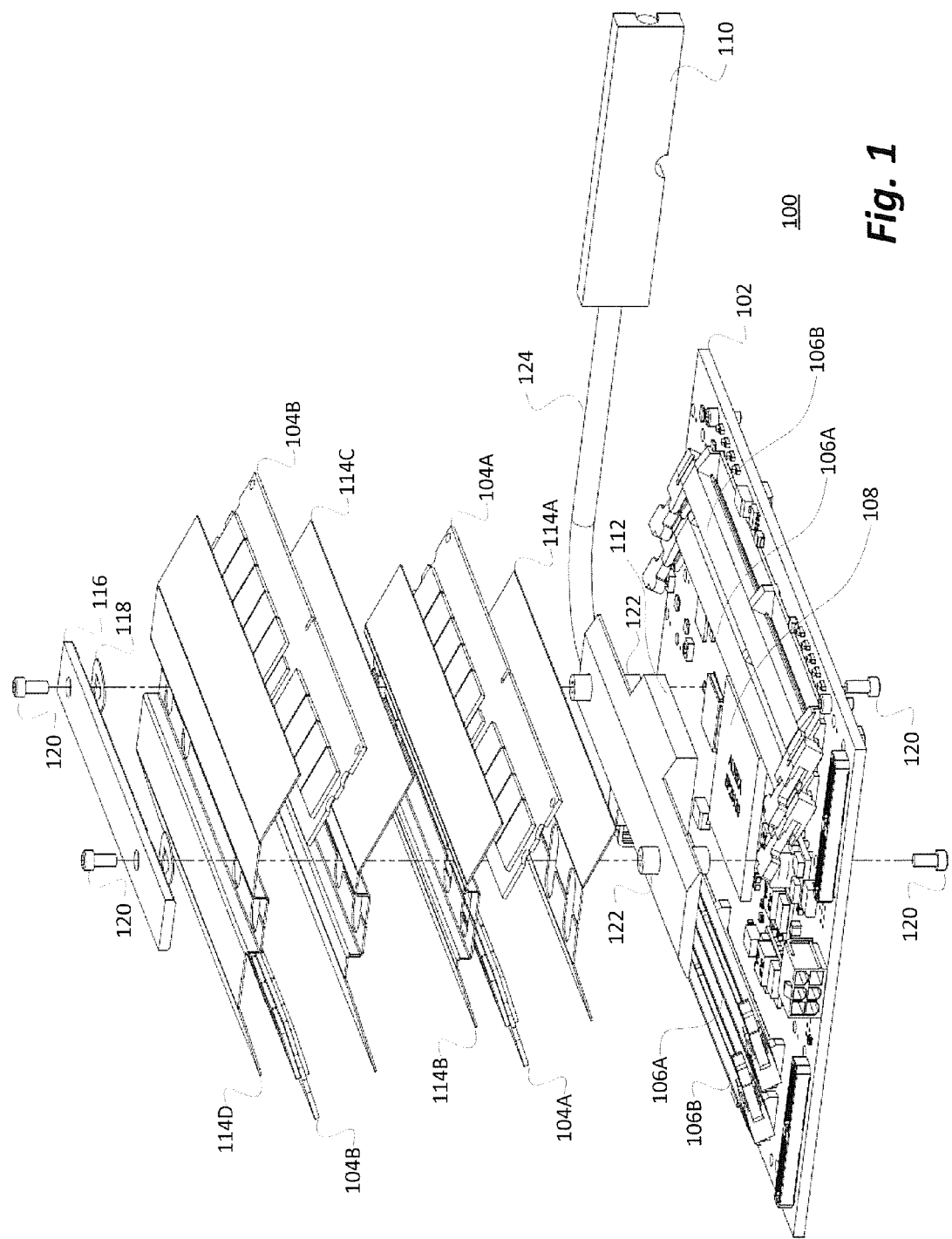
FIG. 1 is an exploded, isometric view of a representative embodiment of the system and method of the present invention for thermally coupling memory devices to a memory controller.

With reference now to FIG. 1, an exploded, isometric view of a representative embodiment of the system and method of the present invention for thermally coupling memory devices to a memory controller is shown. An exemplary computer memory board 100 comprises, in pertinent part, a circuit board 102 upon which are mounted a memory controller 108 associated with a number of memory modules 104A (left and right inner banks) and 104B (left and right outer banks) which are retained in corresponding left and right memory module sockets 106A and 106B. In the embodiment illustrated, the sockets 106A and 106B are disposed laterally of the memory controller 108 and inclined toward it to bring the memory modules 104A and 104B in closer physical proximity thereto.

In the representative embodiment illustrated, the memory modules 104A and 104B may be dual in-line memory modules (DIMMs) although it should be noted that the principles of the present invention are likewise applicable to any type of memory device or module such as SO-DIMMs, DDR2, DDR3, DDR4, DRAM, Z-RAM, T-RAM and the like. The memory controller may, in a particular embodiment of the present invention, comprise a field programmable gate array (FPGA) or other dedicated or programmable integrated circuit device.

A heat sink is associated with the memory controller 108 and, in the exemplary implementation shown, may comprise an evaporator plate 112, heat pipe 124 and condenser plate 110. The evaporator plate 112 collects the heat from the memory controller 108 and the heat pipe 124 transports the heat as a steam vapor whereupon the condenser plate 110 cools the steam back to water. In a representative embodiment, aluminum may be used for the evaporator plate 112 and condenser plate 110 with copper/water for the heat pipe 124 itself. It should be noted that copper may be utilized for the entire heat sink assembly comprising the evaporator plate 112, heat pipe 124 and condenser plate 110 if the heat load is sufficiently high to justify the cost of the copper required. Heat sink assemblies such as the one illustrated are available, for example, from Thermacore, Inc., Lancaster, Pa.

As illustrated, a number of heat spreaders 114A through 114D are associated with and adjoin the memory modules 104A and 104B. The left and right inner banks of memory modules 104A are disposed between heat spreaders 114A and 114B while the left and right outer banks of the memory modules 104B are disposed between heat spreaders 114C and 114D. In a representative embodiment of the present invention, the heat spreaders 114A through 114D may comprise sheet aluminum having a thickness of substantially between 0.020 and 0.040 inches in thickness. In alternative embodiments of the present invention, the heat spreaders 114A through 114B may also comprise copper or other suitable heat conducting material and of a thickness suitable to attain the desired thermal performance.

The evaporator plate 112 and the heat spreaders 114A through 114D are secured together by means of a heat clamp 116, associated wave washers 118 and screws 120 which are threaded into corresponding standoffs 122. In this manner, the heat sink (comprising evaporator plate 112, heat pipe 124 and condenser plate 110) and the heat spreaders 114A through 114D are mechanically and thermally coupled together.

While a certain heat conducting structure has been illustrated with respect to the heat sink for the memory controller 108 and the heat spreaders 114A through 114D it should be noted that other cooling or heat transfer techniques may be employed for the purpose of thermally coupling the memory devices of the memory modules 104A and 104B to the memory controller 108 such that both are cooled together at the same relative temperature. The cooling methods employed can comprise, for example, air, water, heat pipes, conduction cooling and the like.

Figure 2:
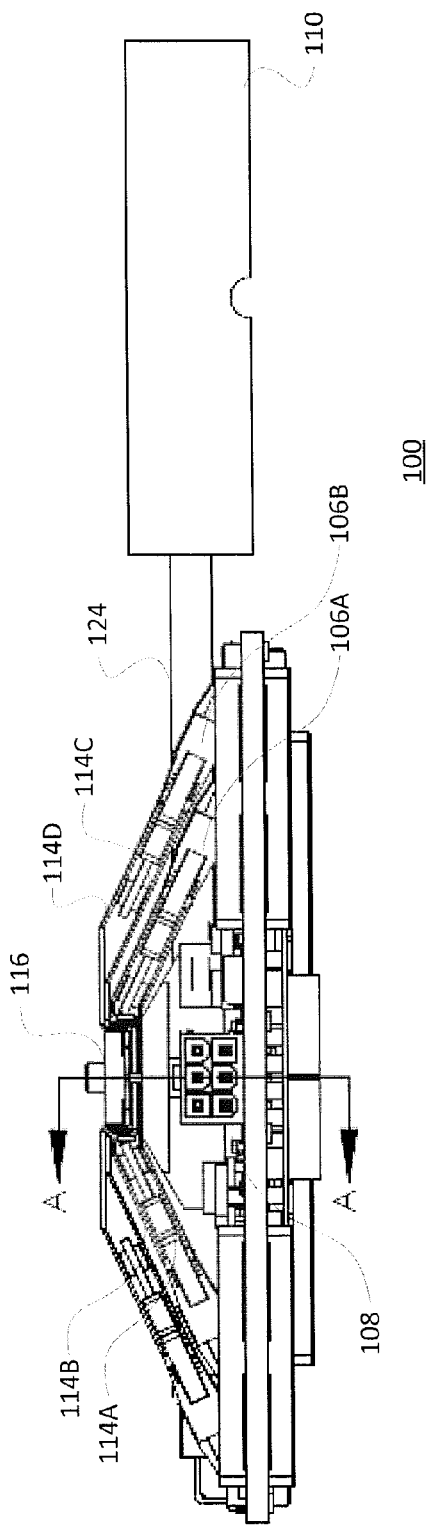
FIG. 2 is an end elevational view of the representative embodiment of the preceding figure.

With reference additionally now to FIG. 2, an end elevational view of the representative embodiment of the preceding figure is shown. With respect to this illustration, like structure to that disclosed and described with respect to the foregoing figure is like numbered and the description thereof shall suffice herefor. In this view, the placement of the left and right inner bank of memory modules 104A within sockets 106A and the placement of the left and right outer bank of memory modules 104B within sockets 106B is shown. The heat spreaders 114A and 114B adjoin the inner bank of memory modules 104A while the heat spreaders 114C and 114D adjoin the outer bank of memory modules 104B.

Figure 3:
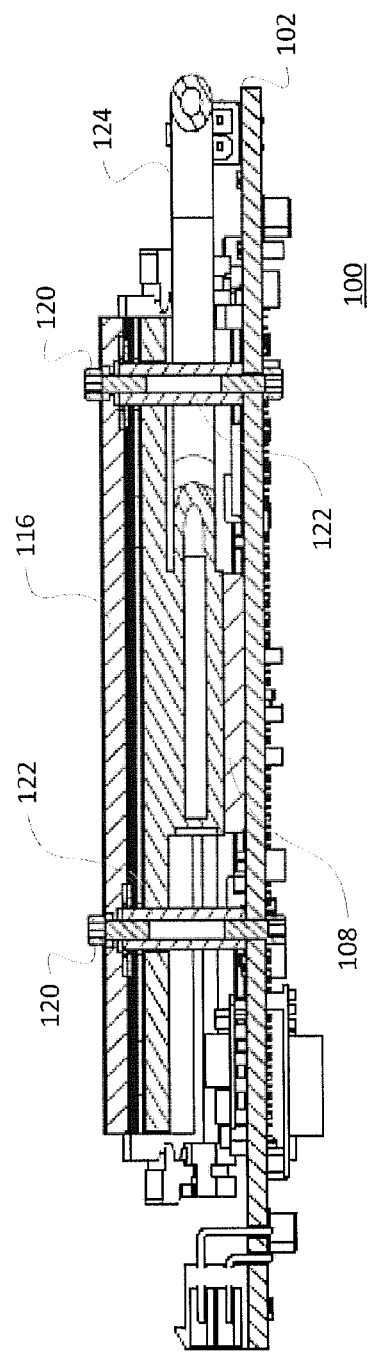
FIG. 3 is a cut-away elevational view of the representative embodiment of the preceding figure taken substantially along reference line A-A thereof.

With reference additionally now to FIG. 3, a cut-away elevational view of the representative embodiment of the preceding figure is shown taken substantially along reference line A-A thereof. Again, like structure to that disclosed and described with respect to the foregoing figures is like numbered and the description thereof shall suffice herefor. In this figure, the joining of the heat sink associated with the memory controller 108 and the heat spreaders 114A through 114D is shown illustrating how the heat clamp 116 is secured to the standoffs 122 by means of a number of screws 120.

Figure 4:
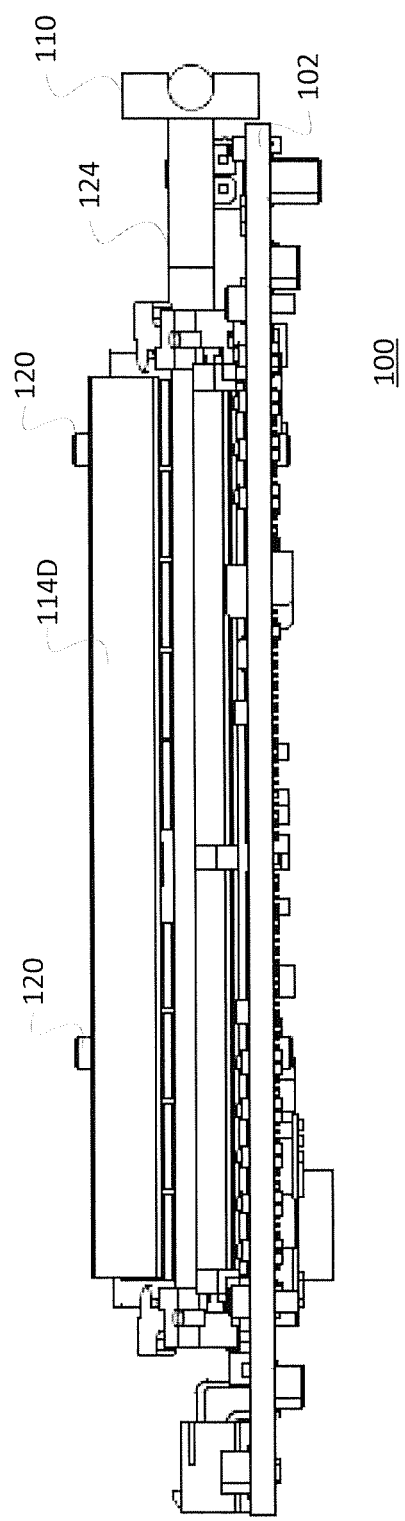
FIG. 4 is a side elevational view of the representative embodiment of the preceding figures.

With reference additionally now to FIG. 4, a side elevational view of the representative embodiment of the preceding figures is shown. As before, like structure to that disclosed and described with respect to the foregoing figures is like numbered and the description thereof shall suffice herefor. In this view, the heat spreader 114D adjoining the left and right outer memory modules 104B is shown as secured to the heat clamp 116 by means of a number of screws 120.

With reference additionally now to FIG. 5, a top plan view of the representative embodiment of the preceding figures is shown. Again, like structure to that disclosed and described with respect to the foregoing figures is like numbered and the description thereof shall suffice herefor. In this view, the heat spreader 114D is illustrated and the overlapping arrangement of the left and right inner memory modules 104A and left and right outer memory modules 104B is shown.

While there have been described above the principles of the present invention in conjunction with specific apparatus and structure, it is to be clearly understood that the foregoing description is made only by way of example and not as a limitation to the scope of the invention. The use of the term "coupled", whether in the foregoing specification or appended claims, is also intended to include the industry standard practice of using a thermal interface material (TIM) between the coupled surfaces and elements. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

As used herein, the terms "comprises", "comprising", or any other variation thereof, are intended to cover a non-exclusive inclusion, such that a process, method, article, or apparatus that comprises a recitation of certain elements does not necessarily include only those elements but may include other elements not expressly recited or inherent to such process, method, article or apparatus. None of the description in the present application should be read as implying that any particular element, step, or function is an essential element which must be included in the claim scope and THE SCOPE OF THE PATENTED SUBJECT MATTER IS DEFINED ONLY BY THE CLAIMS AS ALLOWED. Moreover, none of the appended claims are intended to invoke paragraph six of 35 U.S.C. Sect. 112 unless the exact phrase "means for" is employed and is followed by a participle.

What is claimed is:

1. A computer system comprising at least one memory board, said memory board comprising:
    a circuit board, said circuit board comprising first and second memory modules and an associated memory controller;
    a heat sink adjoining said memory controller;
    a heat spreader adjoining said first and second memory modules; and
    a device for thermally coupling said heat sink to said heat spreader wherein the first and second memory modules are disposed within first and second sockets laterally of said memory controller, wherein the memory controller is positioned between the device and the circuit board and the device is positioned amoung the first and the second memory modules and the memory controller.

2. The computer system of claim 1 wherein said device comprises a clamp for physically coupling said heat sink to said heat spreader.

3. The computer system of claim 1 wherein said heat sink comprises a heat pipe.

4. The computer system of claim 1 wherein each of said first and second memory modules comprise one of DIMMs, SO-DIMMs, DDR2, DDR3, DDR4, DRAM, Z-RAM OR T-RAM.

5. The computer system of claim 1 wherein said first and second memory modules are physically inclined toward said memory controller.

6. The computer system of claim 1 further comprising: third and fourth memory modules disposed laterally of said first and second memory modules respectively.

7. The computer system of claim 6 wherein said first and second memory modules are physically inclined toward said memory controller and said third and fourth memory modules are in a generally parallel and spaced apart relationship to said first and second memory modules respectively.

8. The computer system of claim 3 wherein said heat pipe further comprises an evaporator plate and condenser plate.

9. The computer system of claim 1 wherein said heat spreader comprises aluminum.

10. The computer system of claim 9 wherein said heat spreader is approximately in a range between 0.020 and 0.040 inches thick.

11. A method for controlling operating temperature of a computer memory board comprising:
    providing a first circuit board comprising a memory controller and first and second memory modules disposed within first and second sockets laterally of said memory controller;
    providing a heat sink adjoining said memory controller;
    providing a heat spreader adjoining said first and second memory modules; and
    providing a device to thermally couple said heat sink and said heat spreader, wherein the memory controller is positioned between the device and the circuit board and the device is positioned among the first and second memory modules and the memory controller.

12. The method of claim 11 wherein said step of providing said heat sink comprises the step of adjoining an evaporator plate to said memory controller.

13. The method of claim 12 wherein said step of adjoining an evaporator plate to said memory controller further comprises the step of coupling said evaporator plate to a heat pipe.

14. The method of claim 13 wherein said step of coupling said evaporator plate to said heat pipe further comprises the step of coupling said heat pipe to a condenser plate.

15. The method of claim 11 wherein said step of providing said heat spreader is carried out utilizing aluminum having a thickness within an approximate range between 0.020 and 0.040 inches.

16. The method of claim 11 wherein said first and second memory modules are physically inclined toward said memory controller respectively.

17. The method of claim 16 further comprising third and fourth memory modules disposed laterally of said first and second memory modules and wherein said third and fourth memory modules are in a generally parallel and spaced apart relationship to said first and second memory modules respectively.

18. A computer memory board comprising:
    first and second memory modules disposed within first and second sockets on a circuit board;
    a memory controller associated with said first and second memory modules and mounted to the circuit board; and
    means for thermally coupling the memory controller with the first and second memory modules, wherein the memory controller is positioned between the means for thermally coupling and the circuit board and the means for thermally coupling are positioned among the first and second memory modules and the memory controller.

19. The computer memory board of claim 18 wherein said means comprise an associated heat spreader and an associated heat sink, said heat spreader and said heat sink being thermally coupled together.

20. The computer memory board of claim 19 wherein said heat sink and said heat spreader are physically coupled together.

21. The computer memory board of claim 18 wherein said first and second memory modules are physically inclined toward said memory controller.

22. The computer memory board of claim 19 wherein said heat sink comprises an evaporator plate, heat pipe and condenser plate.

23. The computer memory board of claim 19 wherein said heat spreader comprises aluminum in a range between 0.020 and 0.040 inches in thickness.

24. The computer system of claim 1, wherein the memory controller is a field programmable gate array.

25. The method of claim 11, wherein the memory controller is a field programmable gate array.

26. The computer memory board of claim 18, wherein the memory controller is a field programmable gate array.

* * * * *